United States Patent
Busch et al.

(10) Patent No.: US 6,442,055 B1
(45) Date of Patent: Aug. 27, 2002

(54) SYSTEM AND METHOD FOR CONSERVING POWER IN A CONTENT ADDRESSABLE MEMORY BY PROVIDING AN INDEPENDENT SEARCH LINE VOLTAGE

(75) Inventors: Robert E. Busch, Essex Junction; Kevin A. Batson, Williston, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/016,025

(22) Filed: Dec. 12, 2001

(51) Int. Cl.[7] .............................................. G11C 15/00
(52) U.S. Cl. .................................... 365/49; 365/189.07
(58) Field of Search .............................. 365/49, 189.07

(56) References Cited

U.S. PATENT DOCUMENTS 6,101,115 A     8/2000  Ross
6,320,777 B1 *  11/2001 Lines et al. .................. 365/49

OTHER PUBLICATIONS

Electronic Engineering Times, Nov. 26, 2001, Matsumoto, Craig, In speed war, CAM vendors divide to conquer.

* cited by examiner

*Primary Examiner*—Huan Hoang
(74) *Attorney, Agent, or Firm*—Daryl K. Neff

(57) ABSTRACT

A system and method is disclosed for operating a content addressable memory (CAM) within an integrated circuit using search signals at search input voltages which are substantially independent from an operating voltage of the CAM. A method is disclosed in which search signals are input to CAM cells of the CAM at search input voltages which are substantially independent of an operating voltage of storage elements within the CAM cells. A match signal is output upon detecting a matching condition between the search signals and data stored in the storage elements. The search input voltage can be within about 0.2V above a threshold voltage of a search input device of the CAM memory cell. Search input devices can be selected to have a lower threshold voltage than other devices included within the CAM cell.

11 Claims, 4 Drawing Sheets

SYSTEM AND METHOD FOR CONSERVING POWER IN A CONTENT ADDRESSABLE MEMORY BY PROVIDING AN INDEPENDENT SEARCH LINE VOLTAGE

FIELD OF THE INVENTION

This invention relates to integrated circuit memories and more specifically to a content addressable integrated circuit memory.

BACKGROUND

Typically, a single power supply voltage has been used to power all circuitry of a content addressable memory (CAM) cell, both for powering CAM storage elements and the CAM circuitry for searching and indicating the presence of matching data within a CAM cell. CAMs consume much power for search operations since searches are typically conducted over a large memory space, and search data input and matchline signals are frequently driven or cycled between voltages.

The need for ever greater computing speed and integration density requires reductions in power consumption, as is the longstanding need to provide greater function in small, e.g. handheld computing equipment. U.S. Pat. No. 6,101,115 describes a system in which power consumption is reduced by providing a independent power supply at a lowered voltage for precharging the matchline. However, reducing the matchline precharge power supply alone does not adequately address the needed power reductions.

SUMMARY

Accordingly, the present invention provides for greater power reductions than heretofore obtained in a CAM by providing search signals at input voltages that are substantially independent from an operating voltage of storage elements of the CAM .Thus, the search line power supply voltage is preferably at a lower voltage than the power supply voltage at which data is stored within storage elements of the CAM. Lowering the search line power supply voltage tends to conserve power. At the same time, maintaining a relatively high power supply voltage to the CAM storage elements tends to preserve good signal margins, data retention and low soft error rates.

Preferably, a search input voltage HIGH is selected which lies within about 0.2V above a threshold voltage of a search input device of the CAM cell. Preferably, the search input device has a lowered threshold voltage as compared to the threshold voltage of other devices used in the CAM cell. In this way, further reductions in search line power consumption are made possible.

In an aspect of the invention, a method is provided for operating a content addressable memory (CAM) within an integrated circuit. The method includes inputting search signals to the. CAM cells of the CAM at a search input voltage HIGH which is substantially independent of an operating voltage of storage elements within the CAM cells. A match signal is output upon detecting a matching condition between the search signals and data stored in the storage elements.

In another aspect of the invention, an integrated circuit including a content addressable memory (CAM) is provided, wherein the CAM includes content addressable memory (CAM) cells, each having one or more storage elements operated at an operating voltage of the CAM and the CAM cells include search input devices adapted to receive search input voltages selected substantially independently from the operating voltage.

DETAILED DESCRIPTION OF THE PREFERRED EMBODIMENTS

Figure 1:
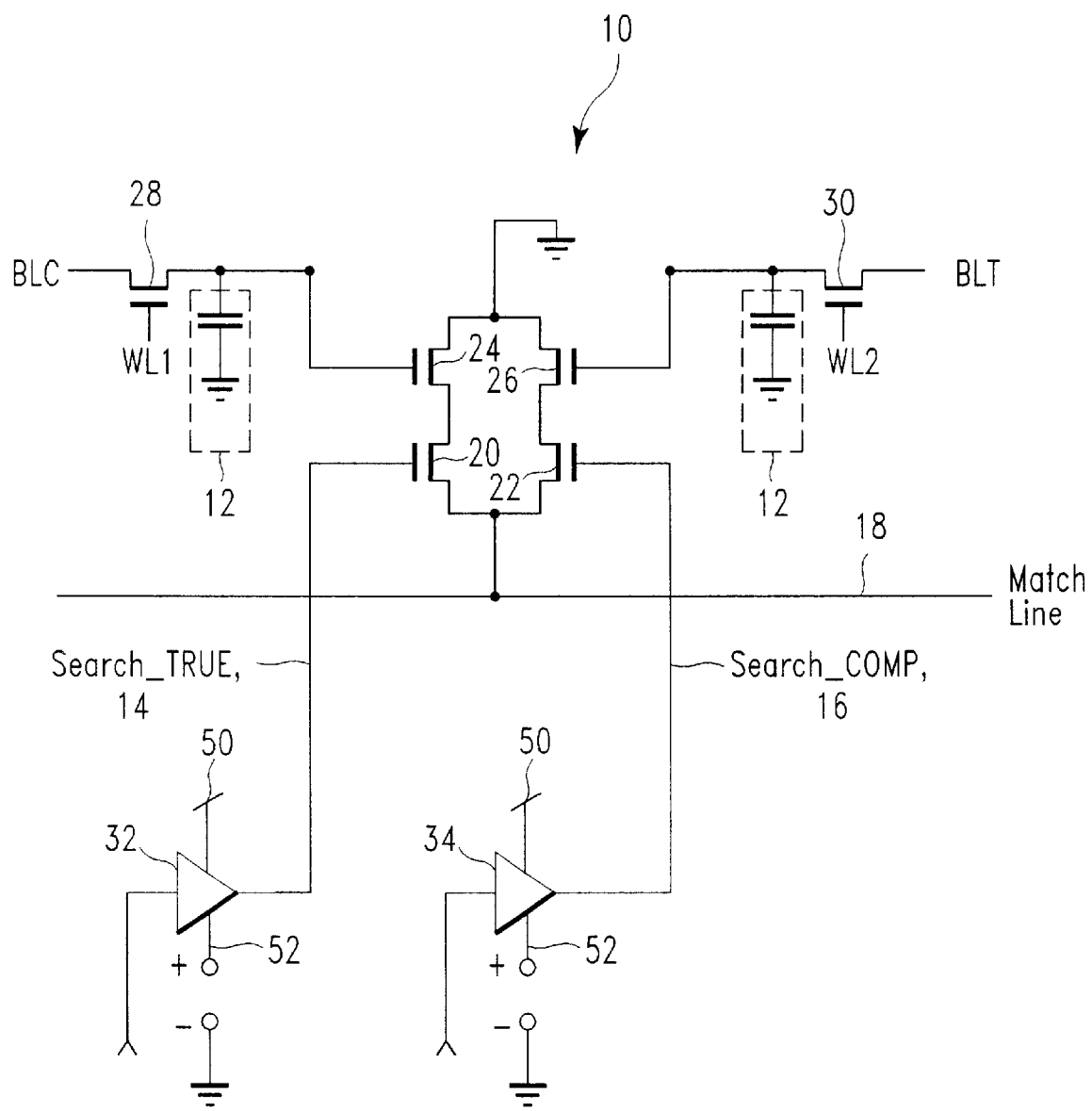
FIG. 1 is a block and schematic diagram illustrating a preferred embodiment of the invention utilizing a dynamic type memory cell.
Figure 2:
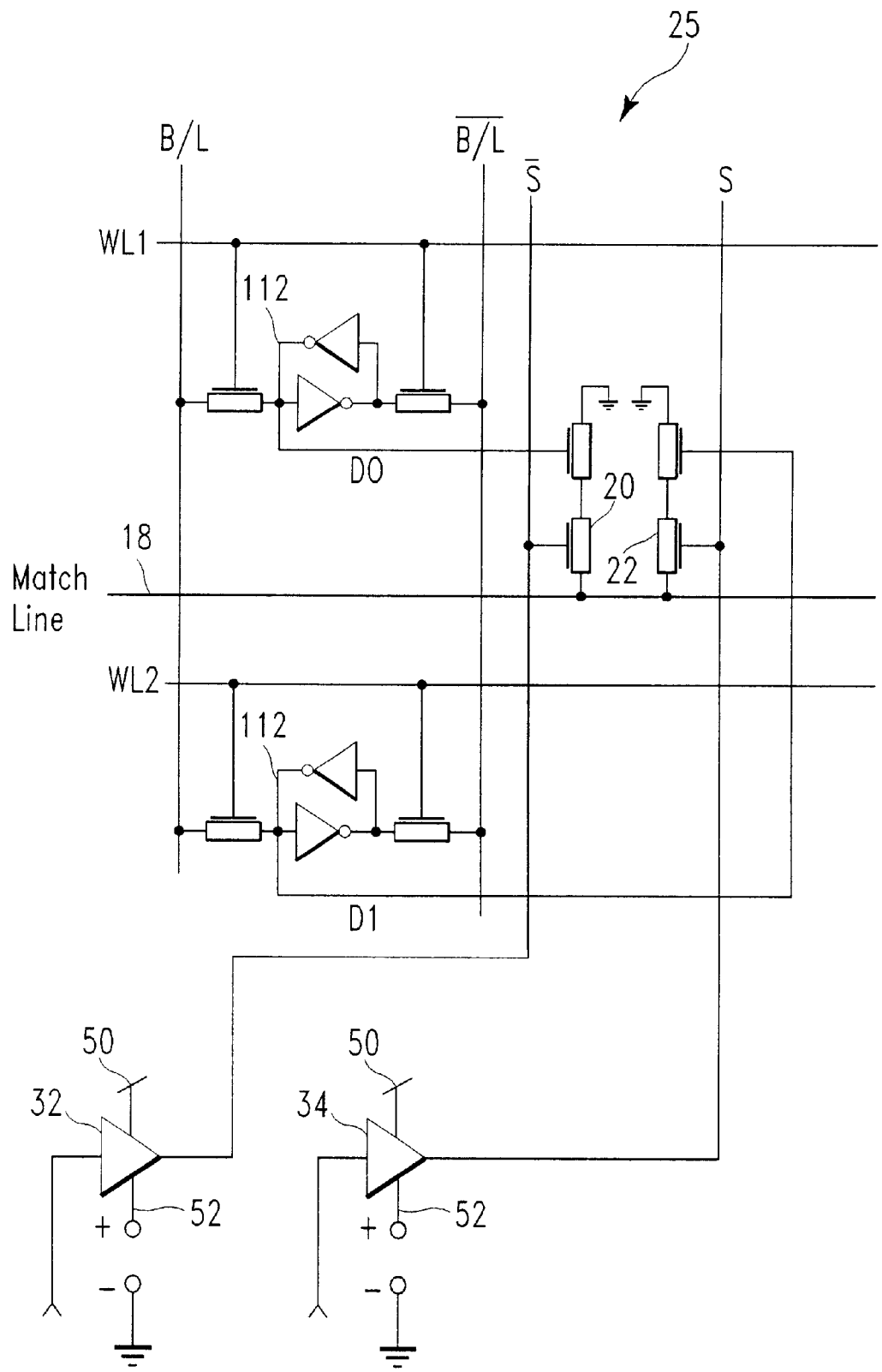
FIG. 2 is a schematic diagram illustrating a preferred embodiment of the invention utilizing a first static type memory cell.
Figure 3:
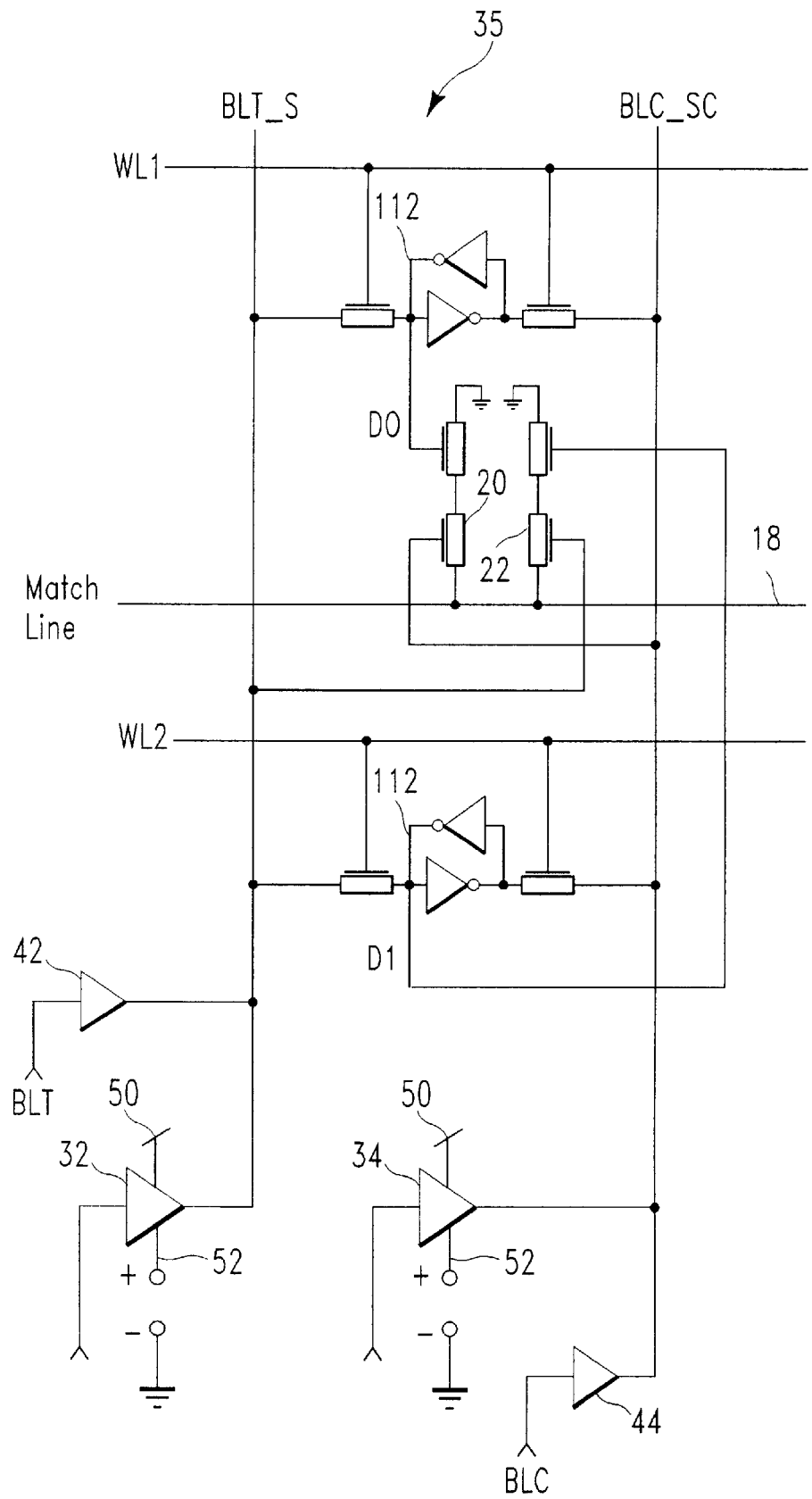
FIG. 3 is a schematic diagram illustrating a preferred embodiment of the invention utilizing a second static type memory cell.
Figure 4:
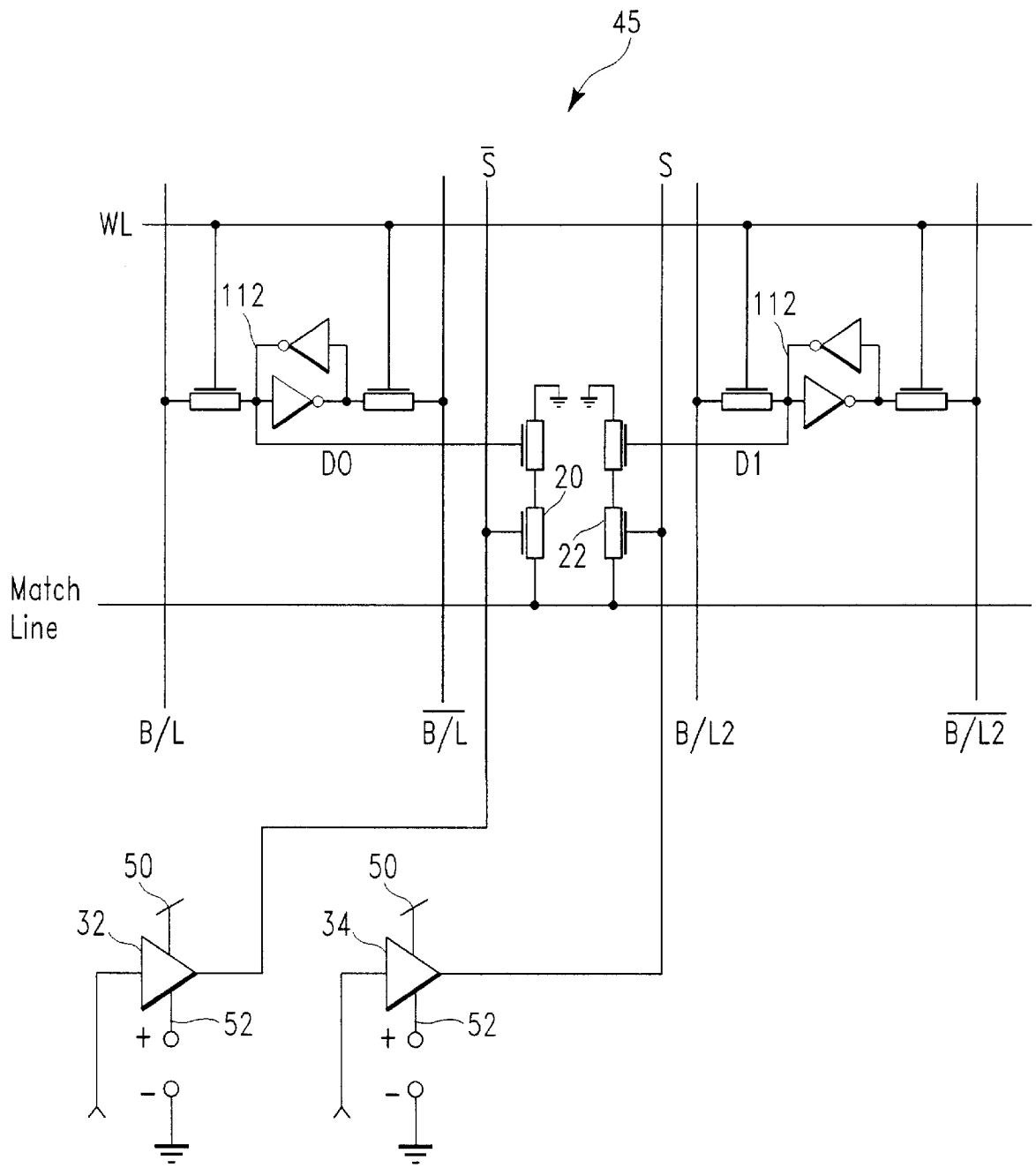
FIG. 4 is a schematic diagram illustrating a preferred embodiment of the invention utilizing a third static type memory cell.

In the following, the invention is described relative to ternary CAMs rather than a binary CAM. FIGS. 1, 2, 3 and 4 illustrate content addressable memory (CAM) cells of ternary CAMs. FIG. 1 illustrates a DRAM implementation of a ternary CAM which uses dynamic type storage elements 12. FIGS. 2, 3, 4 illustrate ternary CAMs having static type storage elements 112 in which a datum is stored on a pair of cross-coupled CMOS inverters. Ternary CAM's have the following features. There are two storage elements per CAM cell. For normal operation the two storage elements store complementary data. However, the CAM cell can be masked with a "0", "0" stored bit combination. The ternary CAM cell operates as follows:

TABLE 1

|  | First Storage Element | Second Storage Element | Result |
|---|---|---|---|
| Stored Voltage | High | Low | Stored bit is a 1 |
|  | Low | High | Stored bit is a 0 |
|  | Low | Low | CAM cell is masked |
|  | High | High | Not allowed state |

By contrast, a static binary CAM can be implemented with a single static storage element having complementary states which are accessed through a true bitline and a complementary bitline. The difference is not essential for the purposes of this description, and the present invention can be implemented in a binary CAM as well as can be implemented in the ternary CAM implementations described here. Those skilled in the art will know and understand the trivial differences necessary to implement the invention in a binary CAM.

As shown in FIG. 1, a dynamic type ternary CAM cell includes a pair of dynamic storage elements 12 (capacitors having a plate tied to a fixed potential (ground)). The storage elements 12 store voltages representing a datum, as described in the above Table 1. These voltages are stored into the storage elements 12 by applying either an operating voltage (HIGH) thereto or ground (LOW) through a true bitline (BLT) and a complementary bitline (BLC). In this example, this is done in two cycles, when wordline WL1 is active to store a bit through BLC, and then when WL2 is active to store a bit through BLT.

Once a datum has been stored into a CAM cell, a search may be conducted subsequently to determine if a search datum input to the CAM cell matches the datum stored therein. The search is performed by inputting a pair of complementary search signals SEARCH_TRUE 14 and SEARCH_COMP 16 to the CAM cell using respective drivers 32 and 34. The effect which is produced upon a matchline 18 coupled thereto is then observed, the matchline 18 having been initialized (e.g. precharged) just prior to the search. If the search signals 14, 16 match the datum stored in storage elements 12, a corresponding one of devices 20, 22 will turn on, which tends to pull down the voltage (or discharge) the matchline 18. In such manner, the individual CAM cell indicates a matching condition in response to search signal input. If the CAM cell has been masked, i.e. low voltages have been stored into both storage elements 12, neither device 20, 22 will turn on during a search, and therefore no effect is produced upon matchline 18. In existing CAMs, initialization for the next search requires the voltages on both search signals 14 and 16 to be lowered to ground. Significant power consumption of the CAM results from the constant signal swing between the search input voltage HIGH provided to either SEARCH_TRUE 14 or SEARCH_COMP 16 signals and the LOW voltage at which the same signals are initialized between each search.

FIGS. 2, 3 and 4, show respective static RAM type ternary CAMs. The static storage elements therein are indicated with reference numeral 112. The embodiments in these figures are similar to that of FIG. 1 except that static storage elements 112 are used therein, and alternative layouts are used. That is, in FIG. 2, one bitline pair and two wordlines WL1, WL2 are used to access CAM cell 20.

FIG. 3 has the same arrangement as FIG. 2 but in addition, the bitlines BLT_S and BLC_SC operate as bitlines for storing and retrieving data from CAM cell 30, and also operate as a true search line (BLT_S) and as a search line complement (BLC_SC) for searching purposes. While search line drivers 32, and 34 are again shown coupled to BLT_S and BLC_SC, another pair of drivers 42, 44 drive signals on these lines when used as bitlines, since the signals are a constrained by the particular operating requirements of storage elements 112.

FIG. 4 shows yet another arrangement in which one wordline WL is used, but two separate bitline pairs B/L and B/L2 are required.

The inventors have recognized that significant power to the CAM is conserved if search signals 14, 16 are powered by a search input voltage which is substantially independent from the operating voltage supplied to storage elements 12 or 112. It will be understood that the operating voltage supplied to storage elements 12 or 112 is constrained by many factors, including characteristics of devices within static elements 112, the need to avoid falsely turning on devices 20 24 and 26, the need to preserve signal margins, and especially to retain data in the face of leakage currents off of the capacitors within storage elements 12. However, these constraints are not present at search input devices 20, 22. The inventors have recognized that the search input voltage HIGH, 50 at which a HIGH input signal is provided to search input devices 20, 22 may be set at a lower level which is substantially independent from the operating voltage used for storing data within storage elements 12 of FIG. 1 or within storage elements 112 of any of FIGS. 2–4. The inventors have recognized that additional power savings can be achieved if the total signal swing between search input voltage HIGH, 50 and search input voltage LOW, 52 is constrained to a desirable level.

Accordingly, search input voltage HIGH, 50 may preferably be set at a desirable level within about 0.2V above a threshold voltage of search input devices 20, 22. Such level is adequate to fully turn on devices 20, 22. Additional lowering of search input voltage HIGH, 50 is achieved if search input devices 20, 22 have lower threshold voltages than that of other devices of the CAM cell, e.g. devices 24, 26, 28 or 30. For example, if the threshold voltage of search input devices 20, 22 is set to 0.5V, then a search input voltage HIGH, 50 of 0.7 V is adequate to operate these devices.

Of note is the particular interconnection of search input devices 20, 22 to matchline 18. Superior results achieved when these devices are connected to matchline 18 rather than ground as in some alternative arrangements.

In addition, since the major contributor to the search line power consumption is its signal swing between HIGH, 50 and a LOW level, 52 used for initialization, it is desirable to focus specifically on minimizing signal swing of the search line. Accordingly, if the search line LOW level, 52 is maintained at ground, the threshold voltage of devices 20, 22 may be set to a minimum level of 200 to 300 mV, sufficient to fully deplete the devices 20, 22 but nevertheless producing measurable steady state leakage currents. The overriding constraint is that when the search input voltage is driven LOW, that it be sufficient to assure correct match detection. In such case, the search line HIGH voltage, 52 may be further reduced to a level which just turns the devices on reliably, for example within about 200 to 300 mV above the threshold. Such configuration, which minimizes signal swing without requiring a special power supply voltage for search line LOW, 52 may be the most desirable for some applications.

In another example, if the search input LOW voltage level 52 is not set at ground, but at an above ground voltage which is closer to the threshold voltage of the search input devices 20, 22, other desirable results can follow. Understandably, a second power supply or net may be required in such case to drive the search input LOW level 52. However, this may yet be desirable, because in such case, the threshold voltage of devices 20, 22 need not be specifically altered in order to achieve desired power savings. Again, the search input LOW level, 52 must be sufficient to turn off search input devices 20, 22 such that correct match detection is achieved. For example, if the search input voltage HIGH, 50 is set to 0.7 V for a search input device having a threshold voltage of 0.5V, the search input voltage LOW 52 may be set to such voltage above ground, to conserve power.

In another example, search input devices 20, 22 having a threshold voltage of 0 V can be used. In such case, search input voltage HIGH, 50 may be set at a level such as 0.2 V while the search input voltage LOW, 52 is set to a negative voltage which is sufficiently below the threshold voltage of the devices 20, 22 to achieve correct match detection.

Significant power is conserved when the signal swing of the search input voltage is constrained according to the invention. For example, if signal swing between HIGH and LOW voltages is reduced from 1.2 V to 0.7 V, the search line power consumption related to the signal swing is reduced by the square of the reduction in voltage, i.e. $P \subset V^2$. In this example, power may be reduced from about 3 W to approximately 1 W, a relative power savings of about ⅔. If the signal swing is further reduced to 0.4 V, only about 0.33 W is consumed, barely ⅑ of the original power consumed.

While the invention has been described with respect to certain preferred embodiments thereof, those skilled in the art will understand the many modifications and enhancements which can be made without departing from the true scope and spirit of the invention as set forth in the claims appended below.

We claim:

1. A method of operating a content addressable memory (CAM) within an integrated circuit, said method comprising:

inputting search signals to content addressable memory (CAM) cells of a CAM at a search input voltage HIGH which is substantially independent of an operating voltage of storage elements within said CAM cells; and outputting a match signal upon detecting a matching condition between said search signals and data stored in said storage elements.

2. The method of claim 1 wherein said search input voltage HIGH is at a value within 0.2 V above a threshold voltage of search input devices of said CAM cells.

3. The method of claim 2 wherein said search signals are received at search input devices of said CAM cells, said search input devices having a lowered threshold voltage which is lower than a threshold voltage of other devices included within said CAM cells.

4. The method of claim 3 wherein said lowered threshold voltage is selected to be within 0.5V of ground.

5. The method of claim 1 further comprising inputting search signals to said CAM cells of said CAM at a search input voltage LOW which is set to a non-ground voltage level.

6. An integrated circuit including a content addressable memory (CAM), said CAM comprising:

content addressable memory (CAM) cells, each having one or more storage elements operated at an operating voltage of said CAM, said CAM cells including search input devices adapted to receive a search input voltage HIGH selected substantially independently from said operating voltage.

7. The integrated circuit of claim 6 further comprising a search line and a search complement line, a pair of drivers coupled to said search line and search complement line, said drivers driving said search line to a HIGH voltage which is substantially independent from said operating voltage.

8. The integrated circuit of claim 7 wherein said search input devices have a lowered threshold voltage, said lowered threshold voltage being closer to ground than a threshold voltage of other devices included within said memory cells.

9. The integrated circuit of claim 8 wherein said search input devices are NFETs and said lowered threshold voltage is a positive voltage which is lower than a threshold voltage of other NFET devices included within said memory cells.

10. The integrated circuit of claim 7 wherein said lowered threshold voltage is selected to be within 0.5V of ground.

11. The integrated circuit of claim 10 wherein said drivers are adapted to drive said search lines to a non-ground LOW voltage.

* * * * *